(12) United States Patent
Choi

(10) Patent No.: US 6,423,278 B2
(45) Date of Patent: Jul. 23, 2002

(54) PLASMA DRY SCRUBBER

(76) Inventor: Dae-Kyu Choi, 462-7 Aman-dong, Kangdong-gu, Seoul (KR)

( * ) Notice: Subject to any disclaimer, the term of this patent is extended or adjusted under 35 U.S.C. 154(b) by 2 days.

(21) Appl. No.: 09/756,103

(22) Filed: Jan. 9, 2001

(30) Foreign Application Priority Data

Jun. 27, 2000 (KR) ........................................ 2000/35786

(51) Int. Cl.⁷ ................................................ B01J 19/08
(52) U.S. Cl. ................................... 422/186.29; 422/186
(58) Field of Search ............................. 422/186, 186.29

(56) References Cited

U.S. PATENT DOCUMENTS 5,672,322 A * 9/1997 Visser .......................... 422/168
6,310,577 B1 * 10/2001 Ra ............................... 343/701

* cited by examiner

*Primary Examiner*—Kishor Mayekar
(74) *Attorney, Agent, or Firm*—Robert E. Bushnell, Esq.

(57) ABSTRACT

A plasma dry scrubber may be constructed with a RF generator that applies a high frequency signal, via an impedance matching unit, to first and second antennas provided at upper and lower parts, respectively, of a plasma generator. Gas flowing into the plasma generator is decomposed by magnetic fields generated by the antennas, and the decomposed gas is discharged to a vacuum pump via a gas outlet pipe. The magnetic fields generated by the antennas are distributed more uniformly in a plasma generating chamber so that plasma discharge is accompanied uniformly. Non-conductive isolating plates made of ceramic of quartz isolate the antennas from the plasma generating chamber. The thickness of the isolating plates may be altered, if required, whereby any damage to the plasma dry scrubber due to the pressure from a vacuum pump, is prevented, even if it is used for a long time.

18 Claims, 6 Drawing Sheets

PLASMA DRY SCRUBBER

CLAIM OF PRIORITY

This application makes reference to, incorporates the same herein, and claims all benefits accruing under 35 U.S.C. §119 from my application PLASMA DRY SCRUBBER filed with the Korean Industrial Property Office on Jun. 27, 2000 and there duly assigned Serial No. 35786/2000.

BACKGROUND OF THE INVENTION

1. Technical Field

The present invention relates to a dry scrubber and, more particularly, to a plasma dry scrubber for scrubbing the gas exhausted during a semiconductor manufacturing process by means of physical and chemical decomposition actions using plasma.

2. Description of the Prior Art

Semiconductor devices are manufactured via a plurality of processes. Among semiconductor manufacturing processes, especially a diffusion process and an etching process are repeated frequently. After completion of the processes, gas remaining in a process chamber is discharged to the outside via a discharging system. However, among gases used in the semiconductor manufacturing process, such as the diffusion process, etching process or the like, there exist noxious gases, such as CF4, CHF3, C2F6, or the like. On this account, it is required that the gas discharged through the discharging system be subject to an additional cleaning process. For that purpose, dry or wet scrubbers are used at present.

Generally, in accordance with the decomposition process, such as heat decomposition or plasma decomposition, a gas scrubber is used for dry scrubbing. It is known that it is difficult to decompose noxious gases effectively below the allowed concentration by gas scrubbing according to the plasma process. The reason for such a disadvantage is as follows:

The plasma process is divided into an ICP (inductive coupled plasma) process and a CCP (capacitive coupled plasma) process in accordance with the plasma generation configuration. The ICP process has a drawback in that the uniformity of the magnetic field is not maintained due to its constructional characteristic. Also, the capability of gas decomposition is reduced if the diameter of the discharging pipe is increased. Particularly, in the ICP process, an electric discharge tube made of quartz is arranged between the process chamber and the vacuum pump, and is reduced gradually in thickness when it is used for a long time. Thus, in some cases, there is a possibility that the electric discharge tube becomes damaged due to the pressure of the vacuum pump. The CCP process has a drawback in that ion particles are generated in the process chamber.

SUMMARY OF THE INVENTION

Accordingly, it is an object of the present invention to eliminate the drawbacks as mentioned above by providing a plasma, dry scrubber capable of generating the plasma uniformly in the gas scrubbing application using the plasma, and of increasing the intensity of the magnetic field so that the capability of the gas decomposition is enhanced.

It is another object of the present invention to provide a plasma dry scrubber which does not get damaged due to the pressure from a vacuum pump.

To accomplish the aforementioned objects, in accordance with one aspect of the present invention, a plasma dry scrubber decomposes the introduced gas in a plasma state so that the gas is scrubbed, and comprises: a plasma generator having first and second antennas for generating the plasma; an RF generator for generating a high frequency power supply; and an impedance matching unit, connected between the first and second plasma generating antennas and the RF generator, for receiving and impedance matching the high frequency power supply signal generated by the RF generator, and then feeding the impedance matched signal to the first and second antennas.

The plasma generator includes: a housing having a gas inlet port through which gas to be scrubbed is introduced; a gas outlet port through which the scrubbed gas is discharged; a plasma generating chamber formed between the gas inlet port and the gas outlet port; first and second receiving units provided at upper and lower parts, respectively, of the plasma generator for receiving the first and second antennas, respectively; and first and second isolating plates mounted on the first and second receiving units, respectively, for isolating the first and second antennas from the plasma generating chamber.

In a preferred embodiment, the first and second isolating plates are made of ceramic or quartz. The first and second antennas have spiral configurations, and the first and second antennas are connected electrically in series with each other or electrically in parallel with each other so that magnetic fields are generated in the same or opposite directions, respectively.

In a preferred embodiment, the RF generator is a frequency-variable high frequency generator. The impedance matching unit comprises a plurality of variable capacitors.

According to the present invention, magnetic fields are generated by the first and second antennas mounted on the upper part and the lower part, respectively, of the plasma generator, and are distributed more uniformly in a plasma generating chamber so that plasma discharge is accomplished uniformly. Also, non-conductive isolating plates made of ceramic or quartz are provided for isolating the first and second antennas from the plasma generating chamber. The plates are sufficiently thick to bear up against the pressure from a vacuum pump.

BRIEF DESCRIPTION OF THE DRAWINGS

A more complete appreciation of the invention, and many of the attendant advantages, thereof, will be readily apparent as the same becomes better understood by reference to the following detailed description when considered in conjunction with the accompanying drawings in which lie reference symbols indicate the same or similar components, wherein.

DETAILED DESCRIPTION OF THE PREFERRED EMBODIMENT

Figure 1:
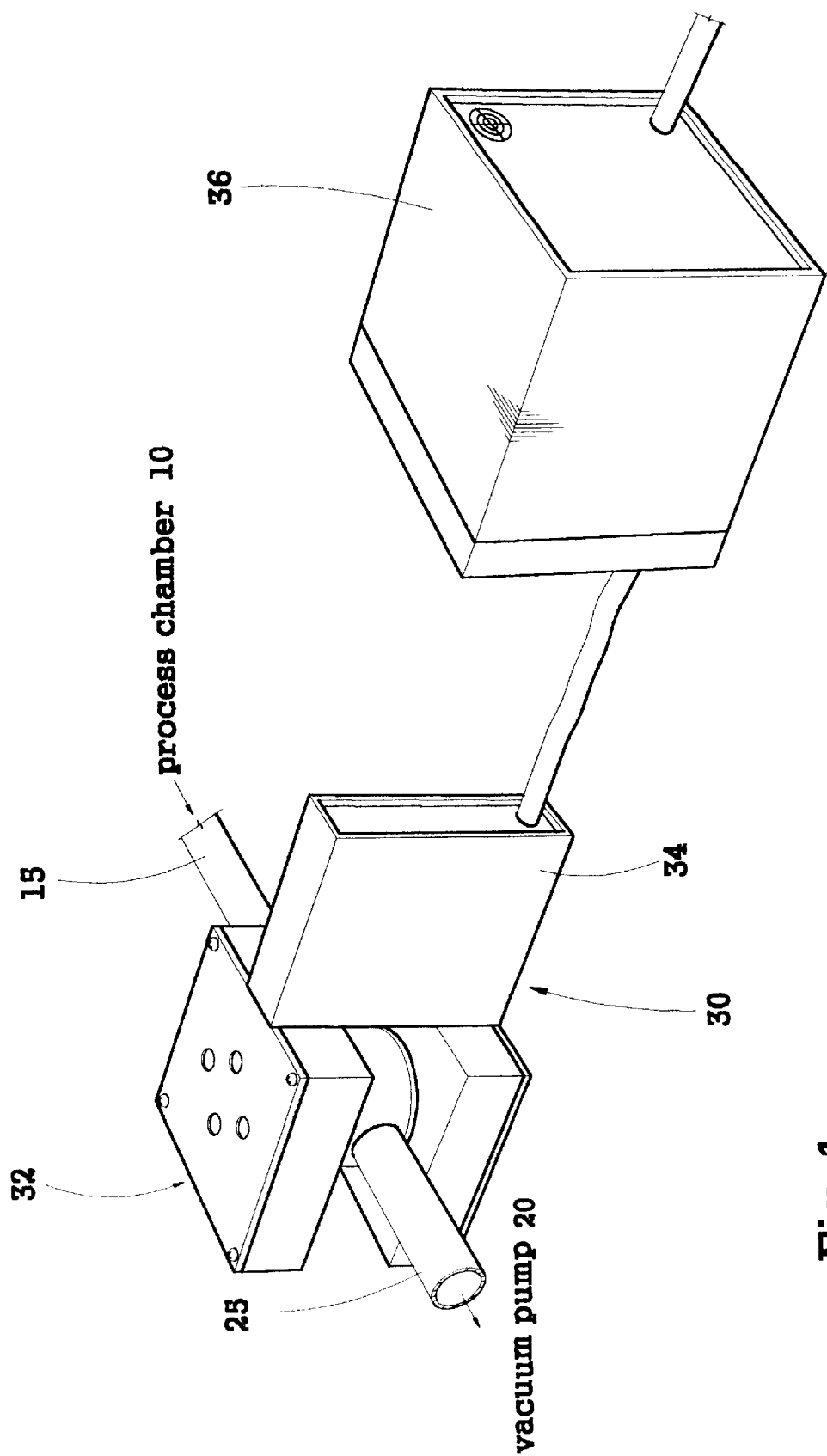
FIG. 1 is a perspective view showing a plasma dry scrubber according to a preferred embodiment of the present invention.
Figure 2:
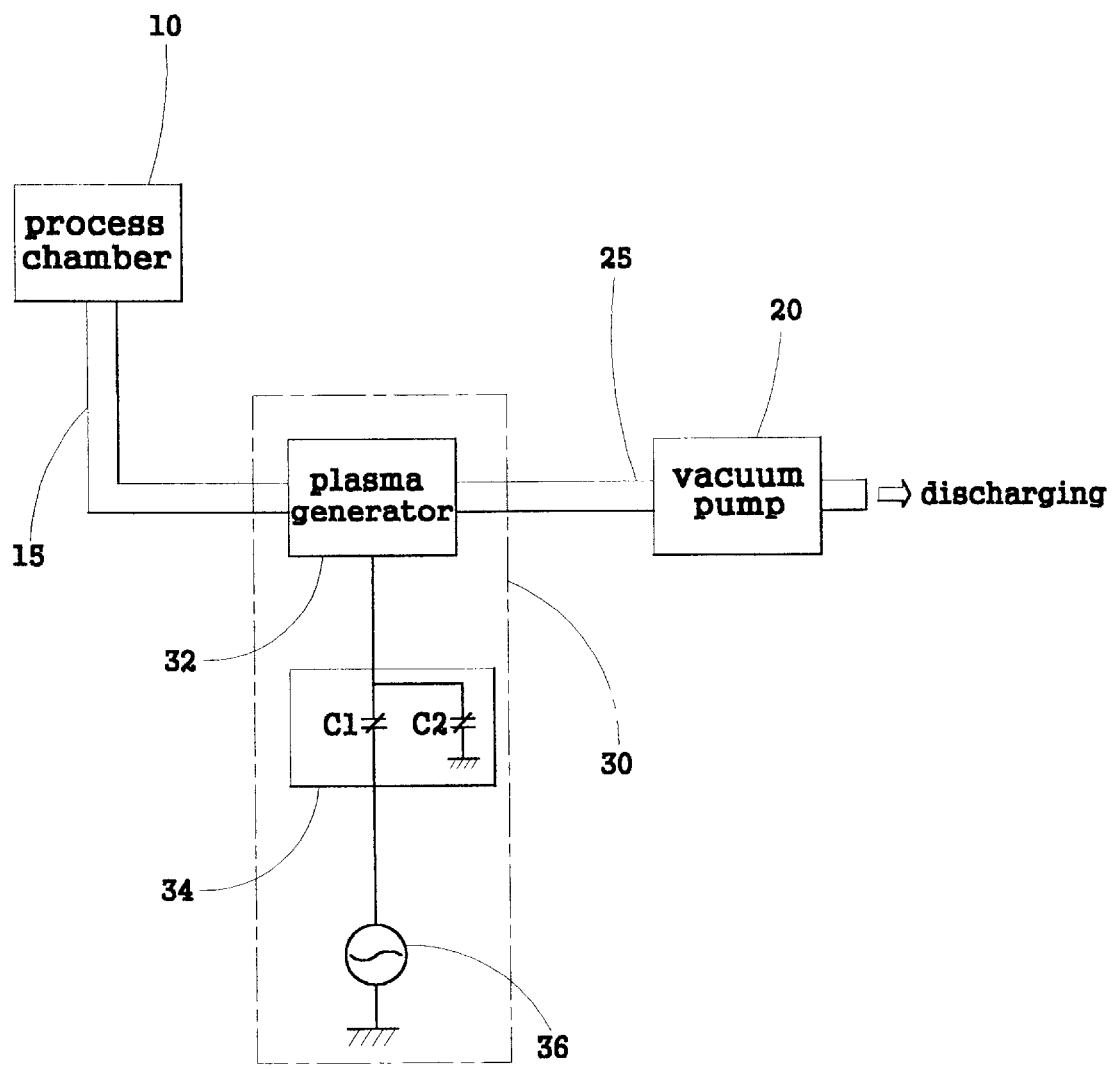
FIG. 2 is a circuit diagram showing the construction of a plasma dry scrubber according to a preferred embodiment of the present invention.

FIG. 1 is a perspective view showing a plasma dry scrubber according to a preferred embodiment of the present invention, and FIG. 2 is a circuit diagram showing the construction of a plasma dry scrubber according to a preferred embodiment of the present invention.

Referring to the drawings, a plasma dry scrubber 30 mainly comprises a plasma generator 32, an impedance matching unit 34, and an RF generator 36. The plasma generator 32 is connected to a gas inlet pipe 15, which is connected to a process chamber 10. The plasma generator 32 is also connected to a gas outlet pipe 25, which is connected to a vacuum pump 20. As will be described in more detail, the plasma generator 32 is provided, at upper and lower parts thereof, with first and second antennas, respectively (not shown in FIGS. 1 and 2). The first and second antennas are connected to the RF generator 36 via the impedance matching unit 34. The impedance matching unit 34 includes two variable capacitors C1 and C2 for impedance matching. The RF generator 36 comprises a frequency-variable high frequency generator.

A high frequency signal generated by the RF generator 36 is fed to the first and second antennas via the impedance matching unit 34. Gas flowing into the plasma generator 32 from the gas inlet pipe 15 via the process chamber 10 is decomposed by means of magnetic fields generated by the first and second antennas. The decomposed gas is discharged to the vacuum pump 20 via the gas outlet pipe 25.

Figure 3:
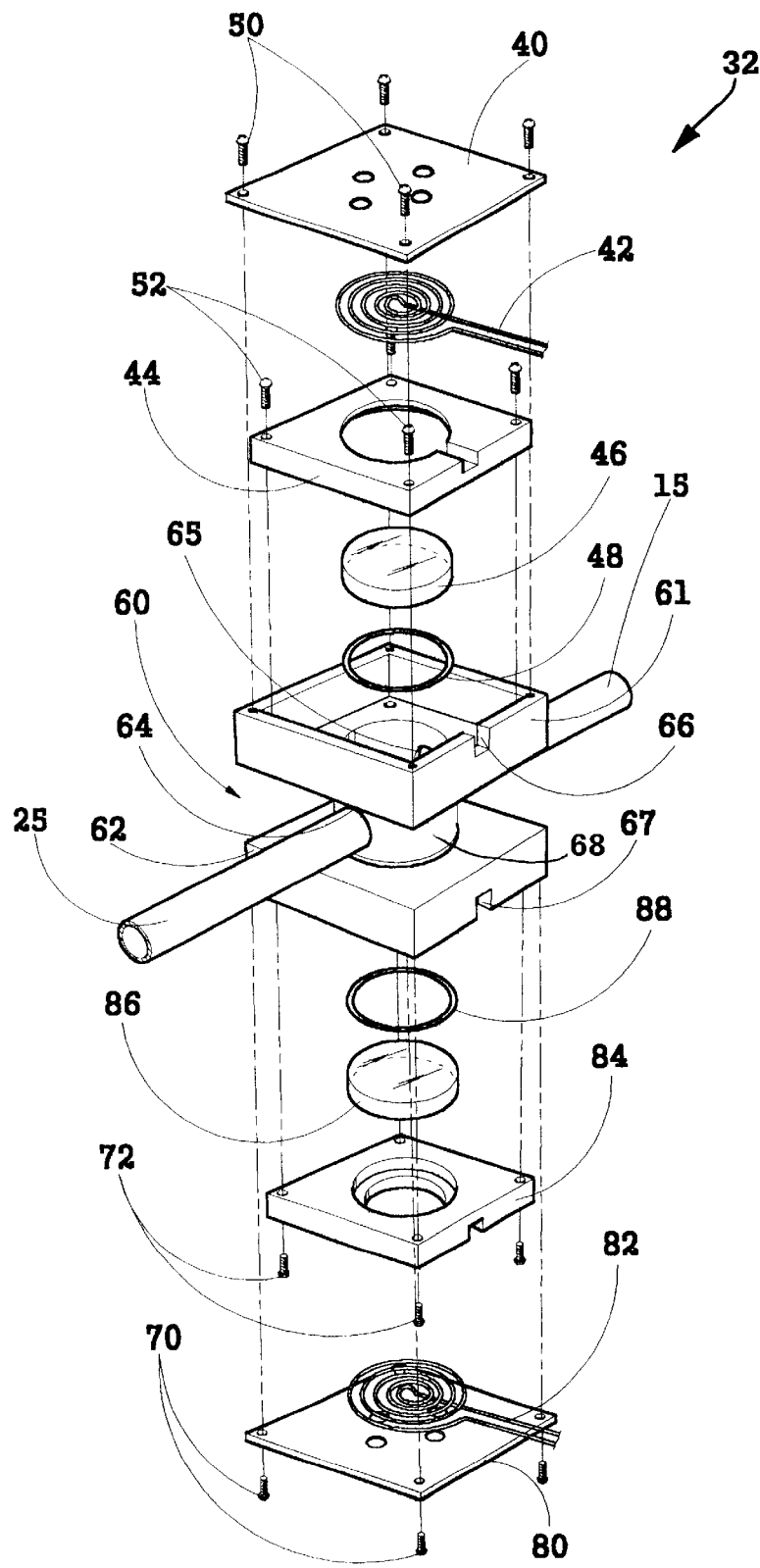
FIG. 3 is an exploded perspective view of the plasma generator of FIG. 1.
Figure 4:
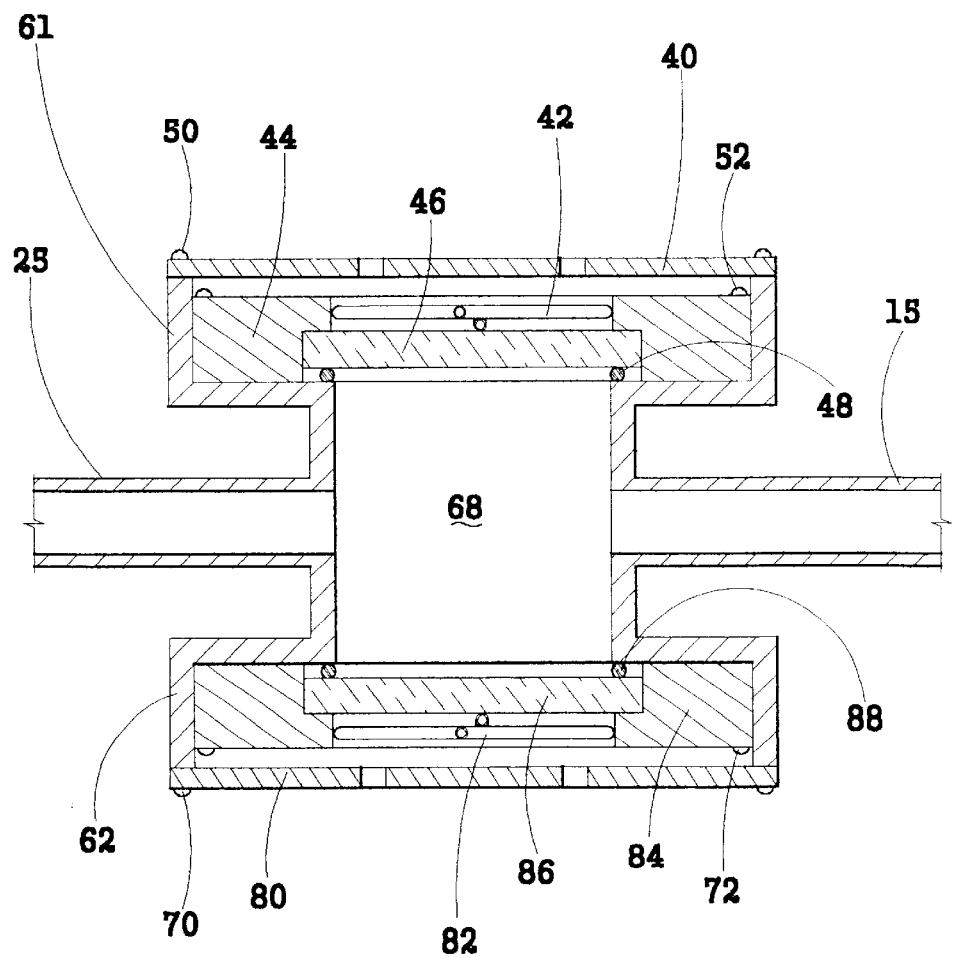
FIG. 4 is a cross sectional view of the plasma generator of FIG. 1.

The construction of the plasma generator will be now described in more detail with reference to FIG. 3 and FIG. 4. FIG. 3 is an exploded perspective view of the plasma generator of FIG. 1, and FIG. 4 is a cross sectional view of the plasma generator of FIG. 1.

Referring to the drawings, the plasma generator 32 is provided, at upper and lower parts thereof, with first and second antennas 42 and 82, respectively. The first and second antennas 42 and 82, respectively, have spiral configurations. Between the gas inlet pipe 15 and the gas outlet pipe 25, a housing 60 of the plasma generator 32 is disposed. The housing 60 comprises a gas inlet port 65 through which gas to be scrubbed is introduced, a gas outlet port 64 through which the scrubbed gas is discharged, a plasma generating chamber 68 formed between the gas inlet port 65 and the gas outlet port 64, and first and second receiving units 61 and 62, respectively, provided at the upper and the lower parts, respectively, of the system for receiving the first and second antennas 42 and 82, respectively.

Inside the first receiving unit 61, first antenna 42 is mounted. It is isolated from the plasma generating chamber 68 by a first isolating plate 46 made of non-conductive materials, such as ceramic or quartz. The first isolating plate 46 is engaged with a first bracket 44, and is mounted on the first receiving unit 61 by means of a plurality of bolts 52, with a first O-ring 48 therebetween. A first cover 40 is engaged with the first receiving unit 61 by means of a plurality of bolts 50. The first antenna 42 is connected to the impedance matching unit 34 through a groove 66 of the first receiving unit 61.

Inside the second receiving unit 62, the second antenna 82 is mounted and is isolated from the plasma generating chamber 68 by a second isolating plate 86 made of non-conductive materials, such as ceramic or quartz. The second isolating plate 86 is engaged with a second bracket 84, and is mounted to the second receiving unit 62 by means of a plurality of bolts 72, with a second O-ring 88 therebetween. A second cover 80 is engaged with the second receiving unit 62 by means of a plurality of bolts 70. The second antenna 82 is connected to the impedance matching unit 34 through a groove 67 of the second receiving unit 62.

FIG. 5 thru FIG. 8 are illustrative views showing magnetic fields generated by the first and the second antennas, respectively, of FIG. 2.

Figure 5:
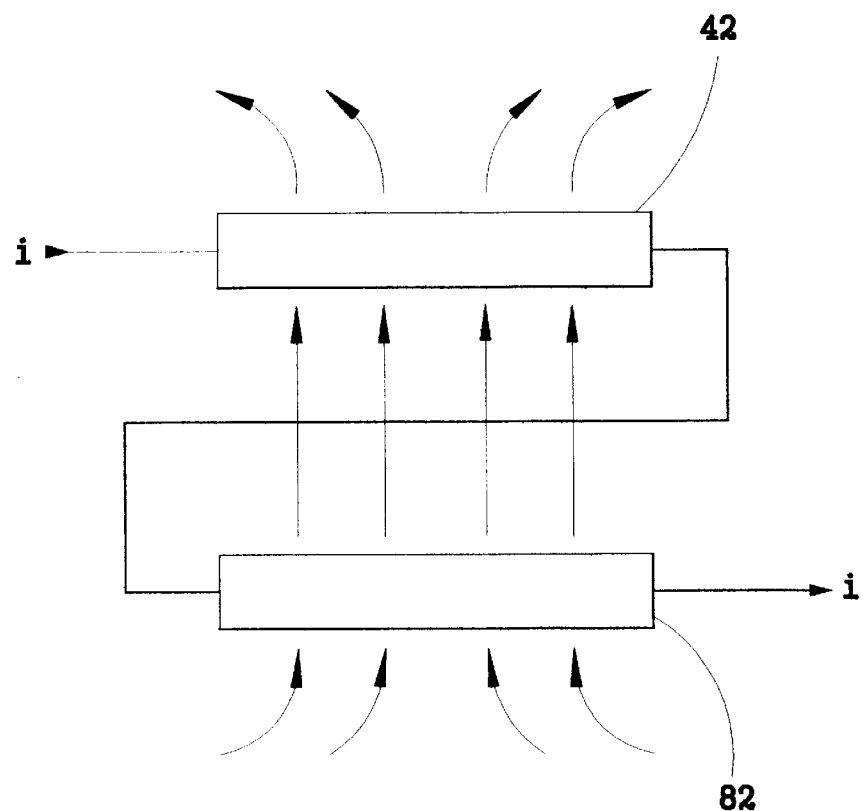
FIG. 5 thru FIG. 8 are illustrative views showing magnetic fields generated by the first and second antennas of FIG. 2.
Figure 6:
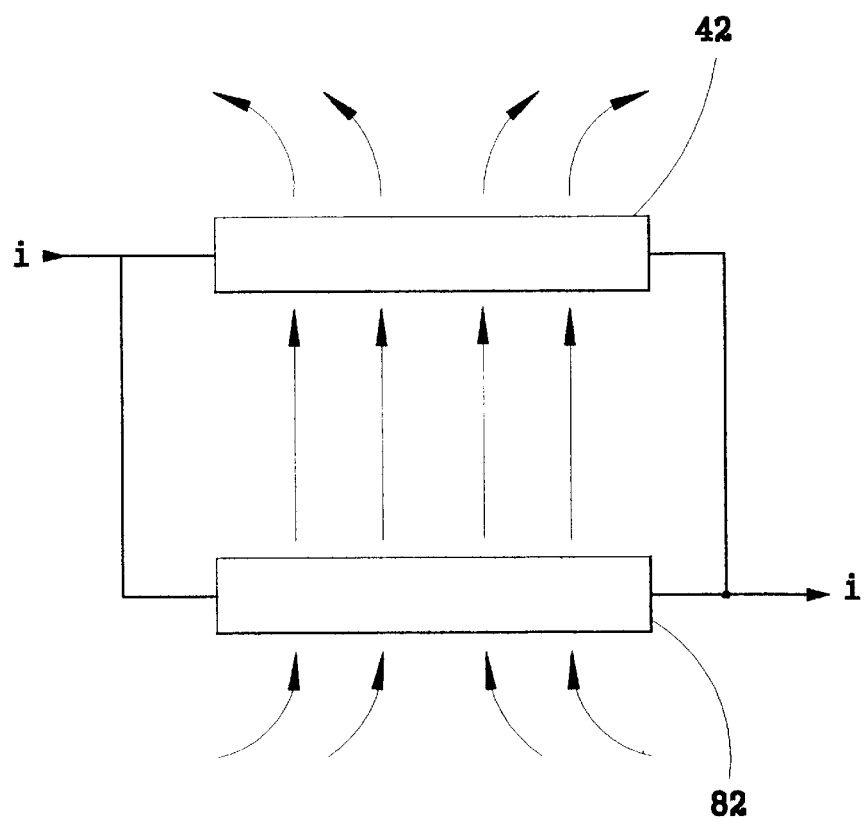

As shown in FIG. 5 and FIG. 6, the first and second antennas 42 and 82 are each configured in such a way that the magnetic fields are generated in the same directions, that is they are connected electrically to each other in series, as shown in FIG. 5. In addition, they are connected electrically in parallel to each other, as seen in FIG. 6. In this manner, as the first and second antennas 42 and 82 generate magnetic fields in the same directions, the intensity of the magnetic fields thereof is increased two times more than that of the magnetic field generated by a single antenna. By virtue of the increased magnetic field, the decomposition effect of the gas which passes through the plasma generating chamber 68 is enhanced.

Figure 7:
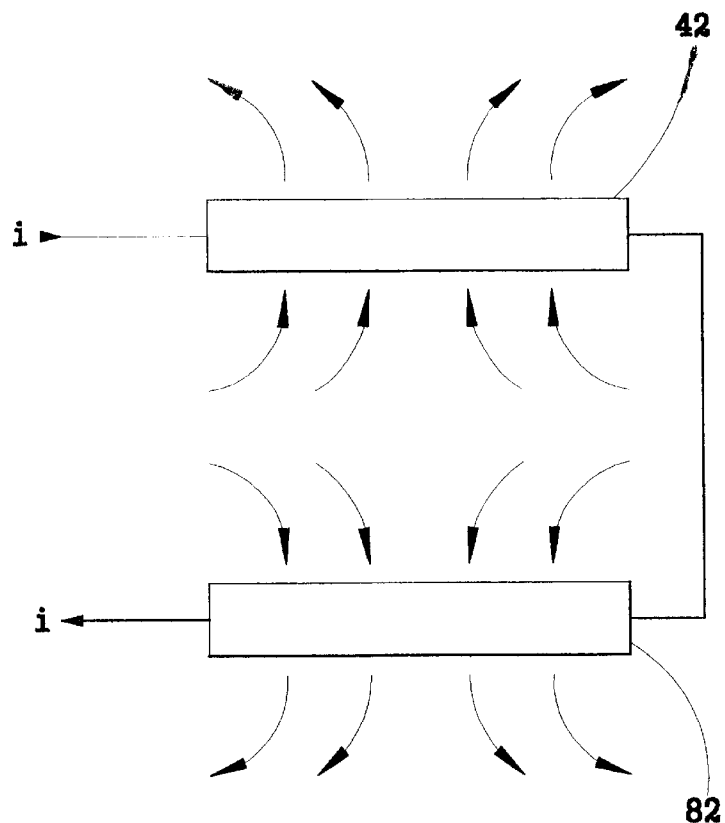
Figure 8:
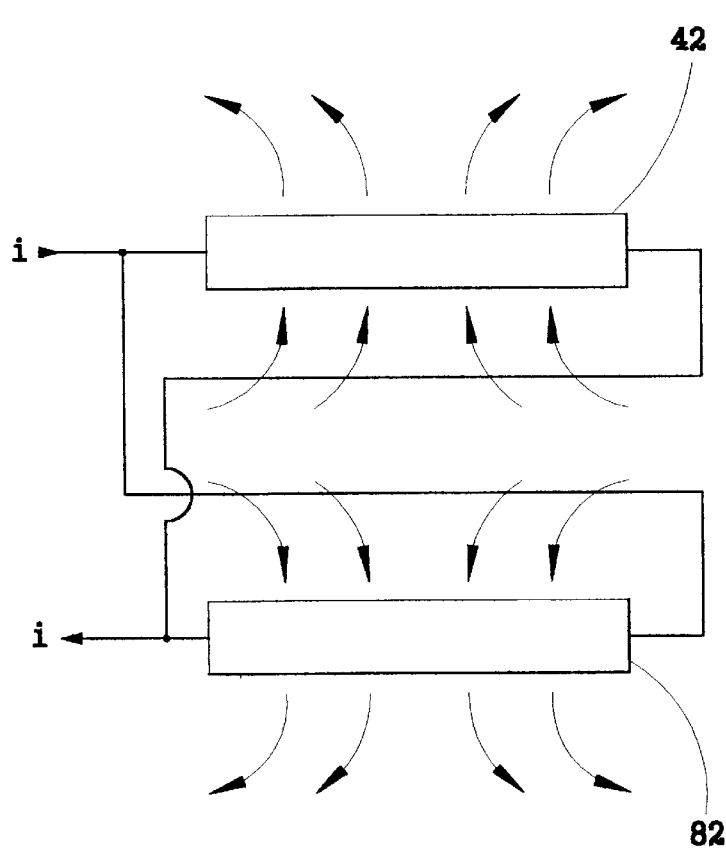

As shown in FIG. 7 and FIG. 8, the first and second antennas 42 and 82 are configured in such a way that the magnetic fields are generated in the opposite directions, they are connected electrically in series to each other, as seen in FIG. 7. In addition, they are connected electrically in parallel to each other, as seen in FIG. 8. In this manner, as with the first and second antennas 42 and 82, respectively, the program generates fields in opposite directions. Therefore, the decomposition effect of the gas which passes through the plasma generating chamber 68 is enhanced.

In this way, the connection of the first and second antennas 42 and 82, respectively, may be altered if required. For example, if there is a large gap between the first antenna 42 and the second antenna 82, the magnetic fields are generated in the same directions; and, if there is a small gap between the first antenna 42 and the second antenna 82, the magnetic fields are generated in the opposite directions, so that the capability of the gas decomposition is more enhanced.

According to the present invention as described above, it is possible to generate the plasma uniformly in the scrubber, and to increase the intensity of the magnetic field, so that the capability of the gas decomposition is enhanced. Furthermore, it is possible to alter the thickness of the non-conductive isolating plate made of ceramic or quartz to isolate the first and second antennas from the plasma generating chamber, if required, whereby any damage to the plasma dry scrubber, due to the pressure from a vacuum pump, is prevented, even if it is used for a long time.

Although there has been described above the construction and operation of the plasma dry scrubber according to a preferred embodiment of the present invention with reference to the drawings, such description is for illustrative purposes only. Accordingly, any and all modifications or variations which may occur to those skilled in the art should be considered to be within the scope of the invention.

What is claimed is:

1. A plasma dry scrubber in which introduced gas is decomposed in a plasma state so that the gas is scrubbed, said scrubber comprising:

a plasma generator for generating the plasma;

a radio frequency (RF) generator for generating a high frequency power supply signal; and an impedance matching unit disposed between the plasma generator and the RF generator for receiving and impedance matching the high frequency power supply signal from the RF generator, and for feeding the impedance-matched high frequency power supply signal as an output;

wherein said plasma generator comprises:

first and second antennas for receiving the impedance-matched high frequency power supply signal from the impedance matching unit, and for generating a plasma;

a housing having a gas inlet port through which gas to be scrubbed is introduced, a gas outlet port through which the scrubbed gas is discharged, a plasma generating chamber formed between the gas inlet port and the gas outlet port, and first and second receiving units provided at upper and lower parts, respectively, of the housing for receiving the first and second antennas, respectively; and first and second isolating plates mounted in the first and second receiving units, respectively, for isolating the first and second antennas, respectively, from the plasma generating chamber.

2. The plasma dry scrubber as claimed in claim 1, wherein the first and second isolating plates are made of one of ceramic and quartz.

3. The plasma dry scrubber as claimed in claim 1, wherein the first and second antennas are connected electrically in series with each other so that magnetic fields are generated in same directions.

4. The plasma dry scrubber as claimed in claim 1, wherein the first and second antennas are connected electrically in parallel with each other so that magnetic fields are generated in opposite directions.

5. The plasma dry scrubber as claimed in claim 1, wherein the first and second antennas have spiral configurations.

6. The plasma dry scrubber as claimed in claim 1, wherein the RF generator comprises a frequency-variable high frequency generator.

7. The plasma dry scrubber as claimed in claim 1, wherein the impedance matching unit comprises a plurality of variable capacitors.

8. The plasma dry scrubber as claimed in claim 1, further comprising first and second brackets mounted between said first and second antennas, respectively, and said first and second isolating plates, respectively.

9. The plasma dry scrubber as claimed in claim 8, further comprising first and second o-rings disposed between said first and second isolating plates, respectively, and said first and second receiving units, respectively.

10. The plasma dry scrubber as claimed in claim 8, further comprising first and second covers disposed on a side of said first and second antennas, respectively, remote from said first and second receiving units, respectively.

11. In a plasma dry scrubber in which introduced gas is decomposed in a plasma state so that the gas is scrubbed, a plasma generator for generating the plasma, said plasma generator comprising:

first and second antennas for receiving a high frequency power supply signal, and for generating a plasma;

a housing having a gas inlet port through which gas to be scrubbed is introduced and a gas outlet port through which the scrubbed gas is discharged;

a plasma generating chamber formed between the gas inlet port and the gas outlet port;

first and second receiving units provided above and below, respectively, the plasma generating chamber for receiving the first and second antennas, respectively; and first and second isolating plates mounted in the first and second receiving units, respectively, for isolating the first and second antennas, respectively, from the plasma generating chamber.

12. In the plasma dry scrubber as claimed in claim 11, further comprising an impedance matching unit for receiving and impedance matching the high frequency power supply signal, and for feeding the impedance-matched high frequency power supply signal to the first and second antennas.

13. In the plasma dry scrubber as claimed in claim 11, wherein the impedance matching unit comprises a plurality of variable capacitors.

14. In the plasma dry scrubber as claimed in claim 11, wherein the first and second isolating plates are made of one of ceramic and quartz.

15. In the plasma dry scrubber as claimed in claim 11, wherein the first and second antennas are connected electrically in series with each other so that magnetic fields are generated in same directions.

16. In the plasma dry scrubber as claimed in claim 11, wherein the first and second antennas are connected electrically in parallel with each other so that magnetic fields are generated in opposite directions.

17. In the plasma dry scrubber as claimed in claim 11, wherein the first and second antennas have spiral configurations.

18. In the plasma dry scrubber as claimed in claim 11, wherein the high frequency power supply signal is generated by a frequency variable high frequency generator.

* * * * *